United States Patent
Fukushi et al.

(10) Patent No.: US 10,230,213 B2
(45) Date of Patent: Mar. 12, 2019

(54) SEMICONDUCTOR LASER DRIVING CIRCUIT

(71) Applicant: SHIMADZU CORPORATION, Nakagyo-Ku, Kyoto-Shi, Kyoto (JP)

(72) Inventors: Ichiro Fukushi, Kyoto (JP); Akiyuki Kadoya, Kyoto (JP); Kazuma Watanabe, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 16/032,865

(22) Filed: Jul. 11, 2018

(65) Prior Publication Data
US 2019/0027894 A1   Jan. 24, 2019

(30) Foreign Application Priority Data
Jul. 20, 2017 (JP) .................. 2017-140972

(51) Int. Cl.
H01S 5/042 (2006.01)
H01S 3/10 (2006.01)
H01S 5/062 (2006.01)
H01S 5/068 (2006.01)

(52) U.S. Cl.
CPC .......... *H01S 5/0427* (2013.01); *H01S 5/0425* (2013.01); *H01S 5/06808* (2013.01)

(58) Field of Classification Search
CPC ... H01S 5/06808; H01S 5/0425; H01S 5/0427
USPC .......................................... 372/38.01, 29.02
See application file for complete search history.

(56) References Cited

U.S. PATENT DOCUMENTS

| 2009/0238226 A1* | 9/2009 | Moto | H01S 5/042 372/38.02 |
| 2009/0268767 A1* | 10/2009 | Nelson | H01S 5/042 372/38.02 |
| 2010/0183318 A1* | 7/2010 | Tanaka | H01S 5/042 398/201 |

FOREIGN PATENT DOCUMENTS

JP          3466599          12/2003

\* cited by examiner

*Primary Examiner* — Tuan N Nguyen
(74) *Attorney, Agent, or Firm* — Andrew F. Young, Esq.; Lackenbach Siegel, LLP

(57) ABSTRACT

A semiconductor laser driving circuit that ensures the satisfied extinction ratio, the accuracy of the light output, and enables the light output dynamically to change based on a modulation signal. The semiconductor laser driving circuit includes a semiconductor laser LD of which the laser light is modulated by the analog modulation signal v_MOD, the differential pair circuit having impedance elements 11, 12 and transistors Q1, Q2, a power source 13, a differential driver 22 that generates a differential voltage to switch on-and-off the transistors Q1, Q2 by an analog modulation signal, a threshold electric current generation element that generates the threshold electric current to flow the threshold that the semiconductor laser emits, a slope signal generation element 32 that generates a slope signal V_SLOPE by executing a level conversion by a predetermined slope coefficient relative to the analog modulation signal, and an adder 35 that adds a slope signal, which the slope generation element generates and the threshold electric current that the threshold electric current generation element and controls the electric current or the power source by the addition output.

3 Claims, 6 Drawing Sheets

SEMICONDUCTOR LASER DRIVING CIRCUIT

CROSS REFERENCE TO RELATED APPLICATIONS

This application relates to, and claims priority from JP 2017-140972 filed Jul. 20, 2017, the entire contents of which are incorporated herein by reference.

BACKGROUND OF THE INVENTION

Field of the Invention

The present invention relates to a semiconductor laser driving circuit that executes an analog modulation relative to a laser light.

Description of the Related Art

With respect to the analytical measurement instrumentation using the laser light, in many cases, the light intensity of the laser light is modulated into a high-speed to provide a high-throughput. It is known that a direct modulation method that modulates an excitation intensity of the laser (driving electric current and so forth) and an external modulation method that modulates the emission light of the laser device using the light modulator.

Recently, the wavelength of the semiconductor laser expands into the visible light region to be usable for a variety of applications, The life-time of the carrier of the semiconductor laser is short, so that the driving electric current can execute the high-speed modulation. In general, relative to the modulation method of the laser device using the semiconductor laser, the high-speed light intensity modulation based on the direct modulation is the mainstream therefor.

The direct modulation method includes the digital modulation and the analog modulation. As the digital modulation is applied to the optical communication, the variation of the binary value as the digital signal is understandable, so that the control thereof is relatively easy. The analog modulation varies the light intensity in the analog mode following the target value (modulation signal), so that the control thereof is more complicated.

With regard to the application in which the light length of the laser light is adjusted based on the individual difference between targets. As the method by which the light density of the laser light is modulated in the analog mode, it is generally known that an automatic power control (APC) holds the light output constantly by carrying out a feedback control of the light output, but the modulation speed thereof is just around ~MHz given considering the stability of the feedback loop.

In contrast, such feedback loop of the light output is not present in the case of an automatic electric current control (ACC), by which the desirable output is obtained by changing the driving electric current of the semiconductor laser in the analog mode. Accordingly, the high-speed analog modulation is feasible in comparison with the APC.

The technology, for example, disclosed in the Patent Document 1 is known as the conventional ACC technology.

The technology according to the patent document 1 measures the characteristic differential quantum efficiency between the electric current of the semiconductor laser and the emission output, determines a weak bias electric current, adds the correction electric current consisting of the threshold electric current, the modulation electric current and the initial-on modulation electric current to the bias electric current in the initial step of the modulation, and provides the added electric current to the semiconductor laser.

RELATED PRIOR ART DOCUMENTS

Patent Document

Patent Document 1: JP Patent 3466599 B1, the entire contents of which are incorporated herein by reference.

ASPECTS AND SUMMARY OF THE INVENTION

Objects to be Solved

However, even when the value of the bias electric current is adjusted, the satisfied extinction ratio cannot be ensured due to the presence of the spontaneous emission light.

In addition, a plurality of constant electric current sources is mandatory to flow the correction electric current such as the bias electric current and the correction electric current into the semiconductor laser. Therefore, an error between the added light output and the target value takes place likely.

In addition, the value of the electric current sources constituting the modulation electric current should be predetermined, so that the light output cannot be changed dynamically by the modulation signal.

The purpose of the present invention is to provide a semiconductor laser driving circuit that is capable of ensuring the satisfied extinction ratio, ensuring the accuracy of the light output, and enabling the light output dynamically to be changed based on the modulation signal.

Means for Solving the Problem

To solve the above problem, a semiconductor laser driving circuit according to the present invention comprises a semiconductor laser, of which the first electrode is connected to the power source, that emits a laser light that an analog modulation signal modulates, the first impedance element of which one end is connected to the second electrode of the semiconductor laser, the second impedance element of which one end is connected to the first electrode of the semiconductor laser and the power source, the differential pair circuit, wherein the first main electrode of the first transistor is connected to the other end of the first impedance element, the first main electrode of the second transistor is connected to the other end of the second impedance element, and the second main electrode of the first transistor and the second main electrode are connected thereto, and further comprises, the power source of which the one end is connected to the second main electrode of the first transistor and the second main electrode of the second transistor, a differential driver that generates a differential voltage that switches on-and-off between the first transistor and the second transistor of the differential pair circuit based on the analog modulation signal, a threshold electric current generation element that generates a threshold electric current of the semiconductor laser, a slope signal generation element that generates a slope signal by executing the level conversion according to the predetermined slope coefficient relative to the analog modulation signal, an adder (adder circuit) that adds the slope signal that the slope signal generation element generates and the threshold electric current that the threshold electric current generation element generates and controls the electric current value of the electric current source with the addition output.

Effect of the Invention

According to the aspect of the present invention, the analog modulation signal switches the electric current flowing in the semiconductor laser using the differential pair circuit, so that the satisfactory extinction ratio can be ensured. In addition, the slope signal generation element that generates a slope signal by executing the level conversion based on the predetermined slope coefficient relative to the analog modulation signal, an adder (adder circuit) that adds the slope signal, which is generated by the slope signal generation element and the threshold electric current, which is generated by the threshold electric current generation element and controls the electric current value of the electric current source with the addition output. Specifically, the analog modulation signal contributes only the slope signal that the slope generation element generates, so that the light output can be controlled lineally relative to the analog modulation signal.

In addition, the electric current sources that generates a modulation electric current is single, and the parameter of each signal generation element is subjected to a periodic correction-output, so that the accuracy of the light output relative to the analog modulation signal can be ensured.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Those of skill in the art have great skill, having advanced training understand all the conventionally known circuits, elements, and arrangements and understand that any circuit, element, or related computational type system includes an input device for receiving data (of any type), an output device for outputting data in any tangible form (e.g. single, data, display, light, etc.,) any suitable memory for storing data as well as computer code, and for executing the same.

It will be further understood by those of skill in the art that the apparatus and devices and the elements or circuits herein, without limitation, and including any sub components such as operational structures, circuits, elements, devices, communication pathways, and related elements, control elements of all kinds, display circuits, calculation elements, determination elements, and control systems and elements, any necessary driving elements, inputs, sensors, detectors, pathways, memory elements, processors and any combinations of these structures etc. as will be understood by those of skill in the art as also being fully enabling and sufficiently identified as or capable of operating the systems and devices and subcomponents noted herein and structures that accomplish the functions without restrictive language or label requirements since those of skill in the art are well versed in related semiconductor laser driving circuit(s) or devices, systems and operational controls and technologies of laser type devices and all their sub components, including various circuits and combinations of circuits without departing from the scope and spirit of the present invention.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Embodiment 1

Hereinafter, referring to FIGs., the inventors set forth further detail of a semiconductor laser driving circuit according to the aspect of the Embodiment of the present invention.

Figure 1:
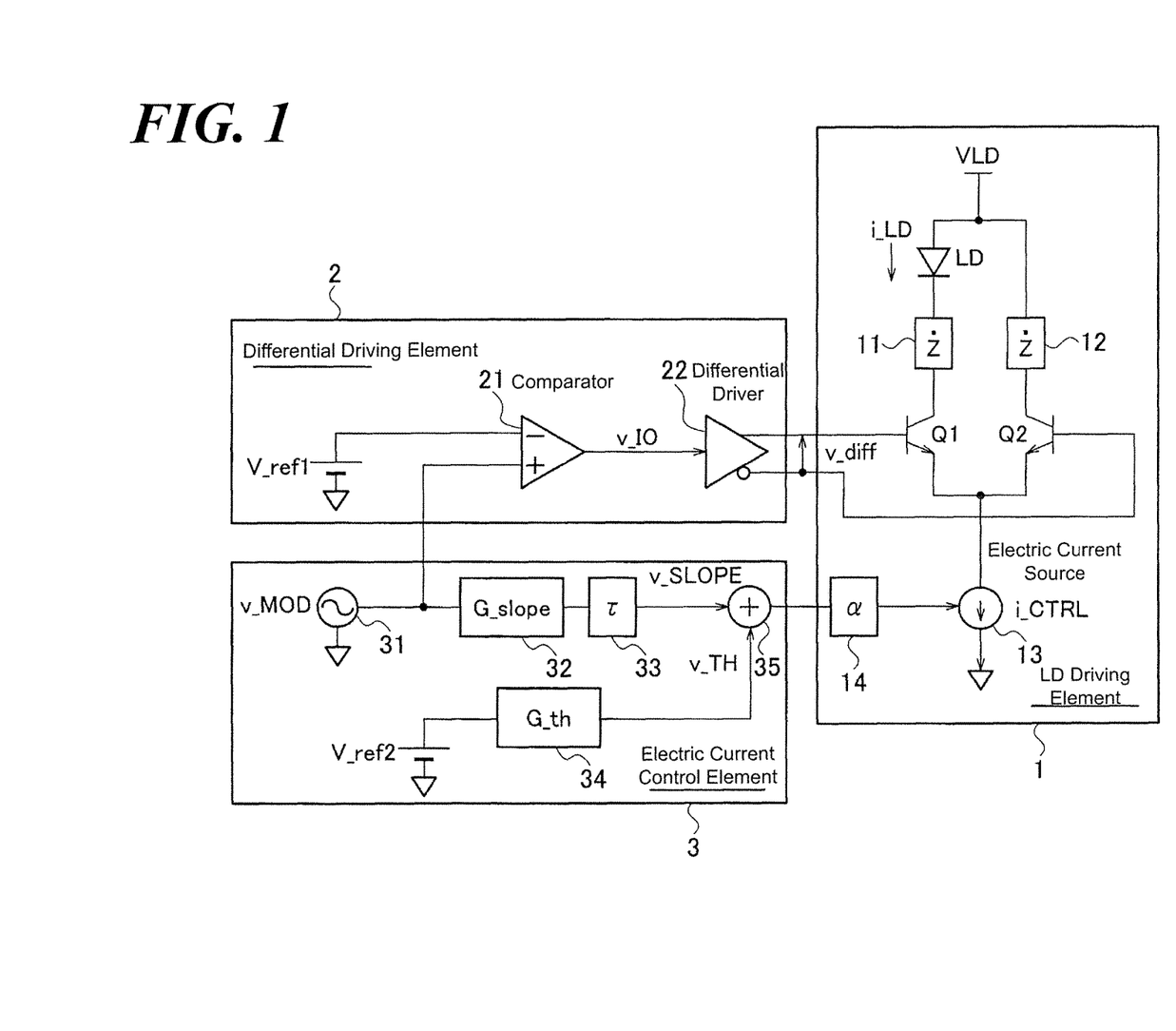
FIG. 1 is a diagram illustrating a structure of the semiconductor laser driving circuit according to the aspect of the Embodiment 1 of the present invention.

The semiconductor laser driving circuit comprises a LD driving element 1, the differential driving element 2, and the electric current control element 3.

The LD driving element 1 that comprises the semiconductor laser LD, the impedance elements 11, 12, the bipolar transistors Q1, Q2, the electric current source 13 and the electric current setting circuit 14 and is a digital modulation circuit that is generally applied to the optical communication and so forth. The LD driving element 1 switches the electric current of the electric current source 13 at a high-speed by switching the polarity of the differential voltage v_diff that is added to the differential pair.

The semiconductor laser outputs a laser light, and an analog modulation signal modulates the laser light.

The anode (first electrode) of the semiconductor laser LD is connected to the power source VLD, and the one end of the impedance element 11 (first impedance element) is connected to the cathode (second electrode).

The one end of the impedance element 12 (second impedance element) is connected to the anode of the semiconductor laser LD and the power source VLD.

The collector (first main electrode) of the bipolar transistor (first transistor) Q1 is connected to the other end of the impedance element 11. The collector (first main electrode) of the bipolar transistor (second transistor) Q2 is connected to the other end of the impedance element 12.

The emitter of the bipolar transistor Q1 and the emitter (second main electrode) of the bipolar transistor Q2 are connected to one another. The bipolar transistor Q1 and the bipolar transistor Q2 constitute the differential pair circuit.

In addition, according to the aspect of the Embodiment, the differential pair is set forth based on the bipolar transistors Q1, Q2, but instead, Q1, Q2 can be FET (field-effect transistor).

The emitter of the bipolar transistor Q1 and the emitter of the bipolar transistor Q2 are connected to the electric current source 13. The electric current setting circuit 14 sets up the electric current of the electric current source 13 based on the output voltage of the electric current control element 3.

The differential driving element 2 comprises a reference source V_ref1, a comparator 21, and a differential driver 22. The comparator 21 compares the reference voltage of the reference source V_ref1 with the analog modulation signal v_MOD from the analog modulation signal element 31 and outputs the output signal v_I0 consisting of H-level to the differential driver 22 when the analog modulation signal v_MOD is higher than the reference voltage.

The differential driver 22 generates a differential voltage v_diff to switch on-and-off between the bipolar transistor Q1 and the bipolar transistor Q2 based on the analog modulation signal v_MOD. The differential voltage v_diff is the difference voltage between the base voltage added to the base of the bipolar transistor Q1 and the base voltage added to the base of the bipolar transistor Q2.

The polarity of the differential voltage is positive (i.e., the base electric potential of the bipolar transistor Q1 is higher than the base electric potential of the bipolar transistor Q2) due to the output signal v_I0) consisting of H-level from the comparator 21, so that the differential driver 22 turns on the bipolar transistor Q1 to flow the electric current i_LD into the semiconductor laser LD.

In addition, the reference voltage of the reference source V_ref1 is specified as the lower limit of the analog modulation signal v_MOD from the analog modulation signal element 31. When directing the semiconductor laser LD to be OFF, the comparator 21 outputs the output signal v_I0 consisting of L-level to the differential driver 22, so that the polarity of the differential voltage relative to the differential driver 22 is negative (i.e., the base electric potential of the bipolar transistor Q2 is higher than the base electric potential of the bipolar transistor Q1) based on the output signal V-I0 consisting of the L-level from the comparator 21. Therefore, the bipolar transistor Q2 is turned ON to extinguish the semiconductor laser LD completely, so that the extinction ratio can be ensured.

The electric current control element 3 comprises the analog modulation signal element 31, the slope signal generation element 32, the time-constant circuit 33, the threshold electric current generation element 34, and an adder 35.

The analog modulation signal element 31 generates the analog modulation signal v_MOD that controls the light intensity of the semiconductor laser LD and outputs the analog modulation signal v_MOD to the comparator 21 and the slope signal generation element 32.

The slope signal generation element 32 generates a slope signal v_SLOPE by executing the level conversion by multiplying the analog modulation signal v_MOD from the analog modulation signal element 31 by the predetermined slope coefficient.

The time-constant circuit 33 multiplies the slope signal generated in the slope signal generation element 32 by the time-constant $\tau$. The time-constant $\tau$ is, for example, the product RC of a resistance R and a condenser C, and at this time, the time-constant circuit 33 comprises the series circuit of the resistance R and the condenser C or the parallel circuit of the resistance R and the condenser C. Given the time-constant $\tau$ is specified as a maximum value that satisfies the required modulation speed, the output wave foam is gradual, so that the extreme ringing on the analog modulation can be prevented.

The threshold electric current generation element 34 generates the threshold electric current reference voltage v_TH by executing the level conversion by multiplying the reference voltage of the reference power source V_ref2 by the constant G_th. The threshold electric current reference voltage v_TH is a signal to generate the threshold electric current that flows the threshold at which the semiconductor laser LD emits.

The adder 35 adds the slope signal v_SLOPE, which is generated by the slope signal generation element 32 via the time-constant circuit 33, and the threshold electric current reference voltage v_TH, which is generated by the threshold electric current generation element 34, and controls the electric current value i_CTRL of the electric current source 13 with the addition output via the electric current setting circuit 14.

Figure 2:
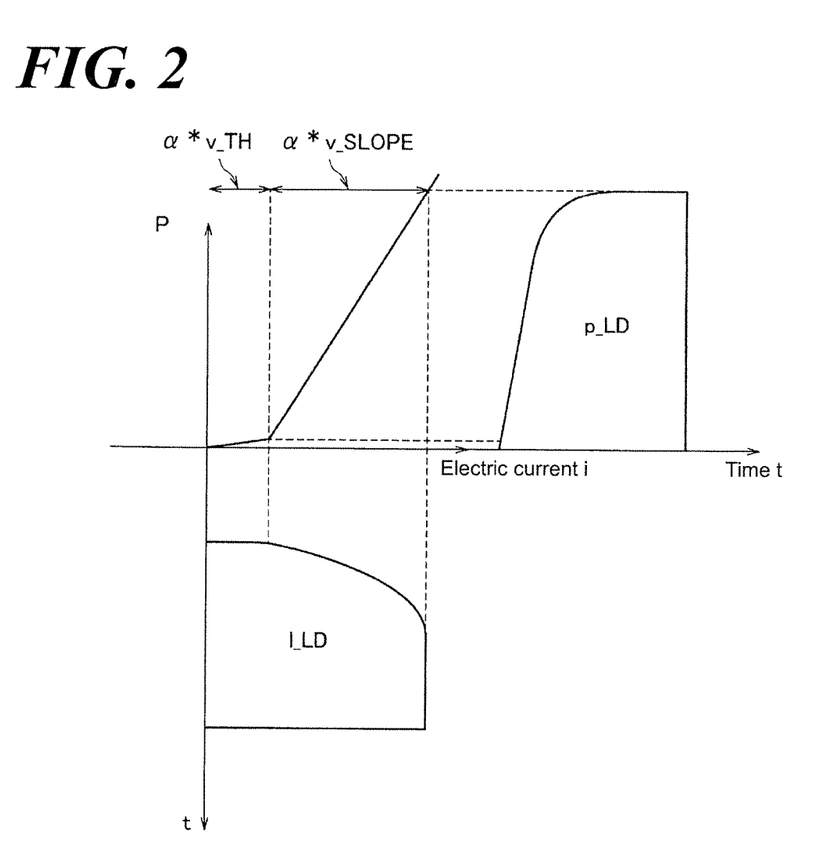
FIG. 2 is a diagram illustrating a structure of the semiconductor laser driving circuit according to the aspect of the Embodiment 1 of the present invention.

According to the aspect of the Embodiment 1, FIG. 2 is a diagram illustrating the relationship between the electric current light output property of the semiconductor laser LD of the semiconductor laser driving circuit and the slope signal v_SLOPE and the threshold electric current reference voltage v_TH.

The threshold electric current reference voltage v_TH is the signal that generates the threshold electric current of the electric current and the light output property and is steadily input into the LD driving element regardless the analog modulation signal v_MOD.

Figure 3:
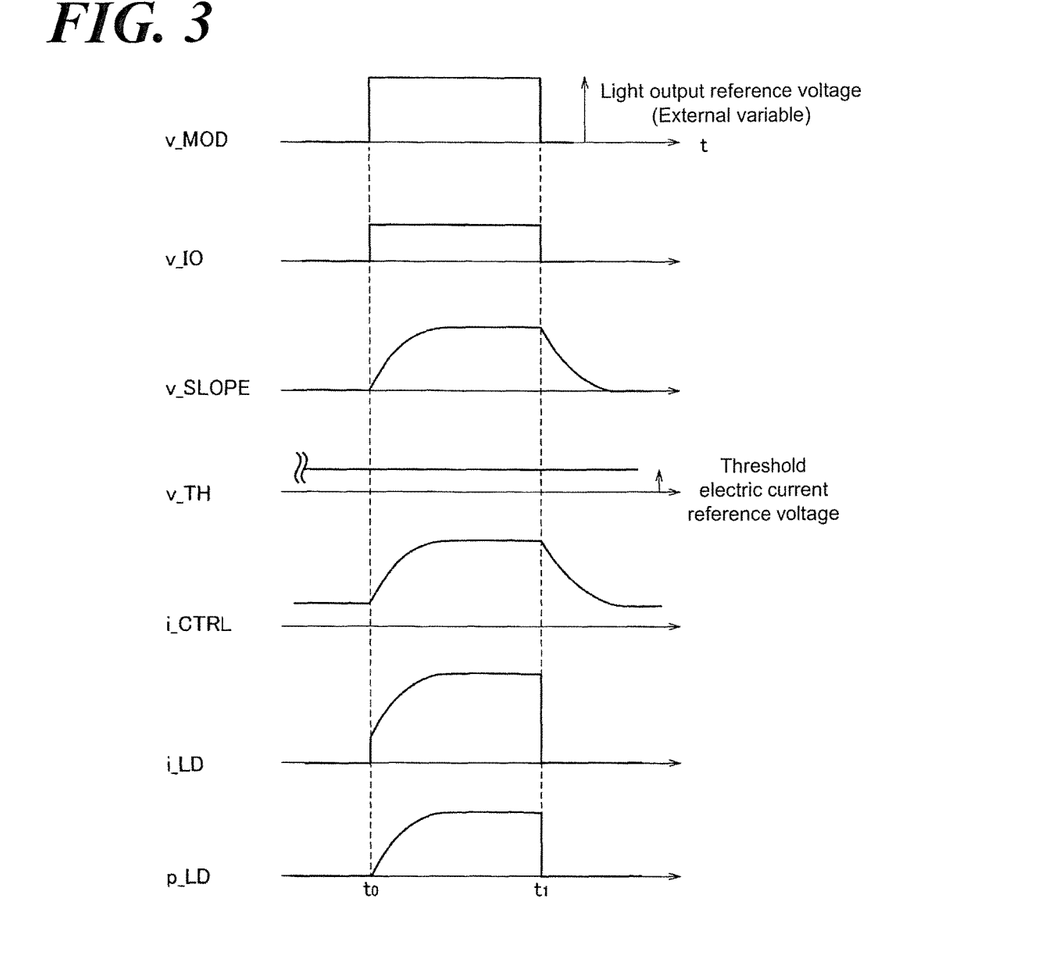
FIG. 3 is a diagram illustrating a waveform of each element of the semiconductor laser driving circuit according to the aspect of the Embodiment 1 of the present invention.

Next, referring to the timing chart of each element in FIG. 3, the inventors set forth the operation of the semiconductor laser driving circuit.

First, the analog modulation signal v_MOD, corresponding to the arbitrary light output is step-input at the time t0 from the state in which the differential voltage v_diff is negative, and the semiconductor laser LD is in an extinction.

The analog modulation signal v_MOD becomes higher than the reference voltage right after the rising edge of analog modulation signal v_MOD, so that the comparator 21 outputs the output signal v_I0 consisting of H-level to the differential driver 22.

The polarity of the differential voltage v_diff converts to positive due to the output signal v_I0 consisting of H-level from the comparator 21, so that the differential driver 22 switches the power source 13 to the bipolar transistor Q1 side, and the bipolar transistor Q1 turns on and then, the electric current i_LD flows into the semiconductor laser LD.

This time, the electric current i_CTRL of the power source 13 is the threshold electric current that the threshold electric current reference voltage v_TH controls and can rise the electric current i_LD near by the threshold in a high-speed. Then after, the slope signal v_SLOPE rises at the speed corresponding to the time-constant τ by the time-constant circuit 33, the electric current i_CTRL of the power source 13 increases, and the electric current i_LD rises by the electric current value corresponding to the target light output.

On the other hand, when the analog modulation signal v_MOD downs step by step at the time t1, the comparator 21 outputs the output signal v_I0 consisting of L-level to the differential driver 22.

The polarity of the differential voltage v_diff converts to negative due to the output signal v_I0 consisting of L-level from the comparator 21, so that the differential driver 22 extinguishes the semiconductor laser LD without along the time-constant τ.

In such way, with respect to the semiconductor laser driving circuit according to the aspect of the present invention, the analog modulation signal v_MOD switches the electric current flowing in the semiconductor laser LD using the bipolar transistors Q1, Q2 of the differential pair circuit, so that the satisfactory extinction ratio can be ensured.

In addition, the slope signal generation element 32 that generates a slope signal v_SLOPE by executing the level conversion based on the predetermined slope coefficient relative to the analog modulation signal v_MOD, The adder adds the slope signal v_SLOPE, which the slope signal generation element generates and the threshold electric current, which the threshold electric current generation element generates, and controls the electric current value i_CTRL of the electric current source 13 with the addition output.

Specifically, the analog modulation signal v_MOD contributes only to the slope signal v_SLOPE that the slope generation element 32 generates, so that the light output can be controlled linearly relative to the analog modulation signal v_MOD.

In addition, the electric current source that generates a modulation electric current is the single source, and the parameter of each signal generation element 32, 34 is subjected to the periodic correction-output, so that the accuracy of the light output relative to the analog modulation signal v_MOD can be ensured.

Embodiment 2

Figure 4:
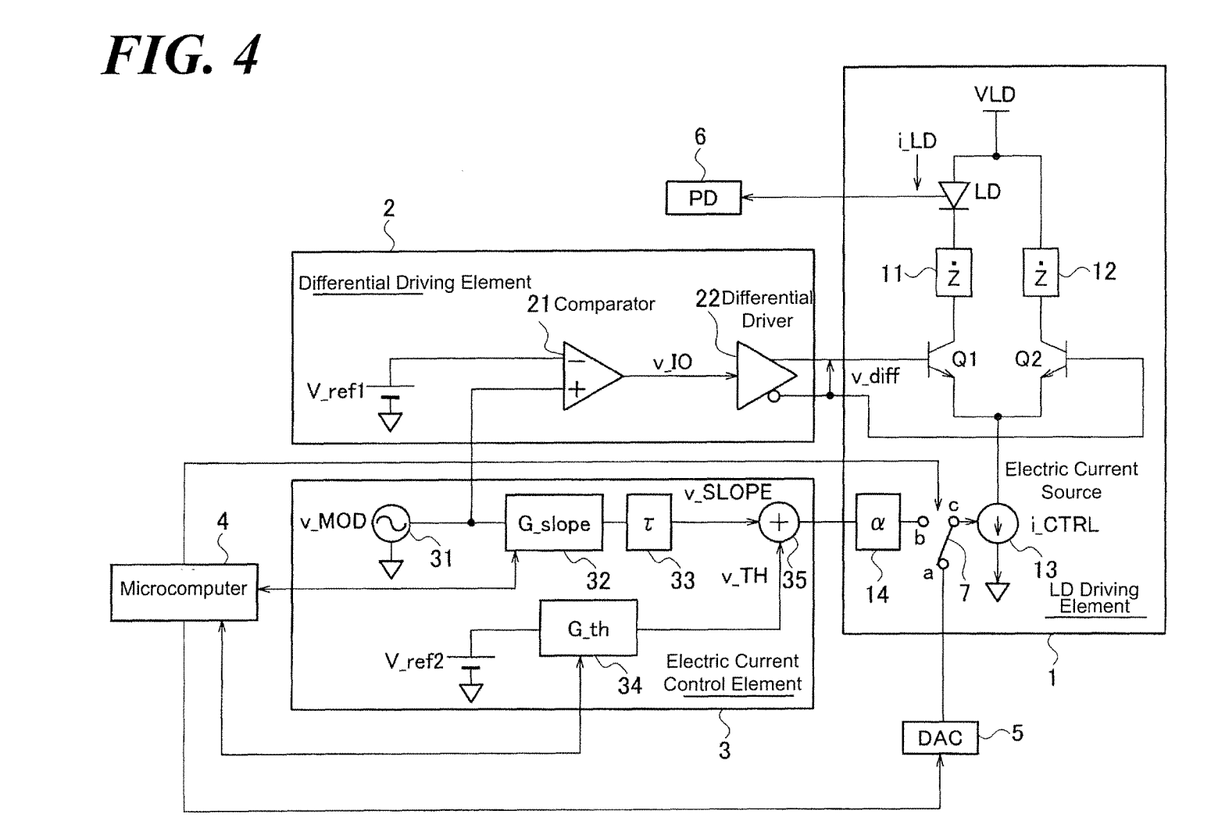
FIG. 4 is a diagram illustrating a structure of the semiconductor laser driving circuit according to the aspect of the Embodiment 2 of the present invention.

FIG. 4 is a diagram illustrating a structure of the semiconductor laser driving circuit according to the aspect of the Embodiment 2 of the present invention. The semiconductor laser driving circuit according to the aspect of the Embodiment 2 further comprises a microcomputer 4, a digital analog converter (DAC) 5, a photo diode (PD) 6 and a switch 7 in addition to the components of the semiconductor laser driving circuit according to the aspect of the Embodiment 1 referring to FIG. 1.

The electric current light output property of the semiconductor laser LD changes with age, so that it is preferable that the constant G_th and the slope signal v_SLOPE are updated at least every time when the laser is activated.

Figure 5:
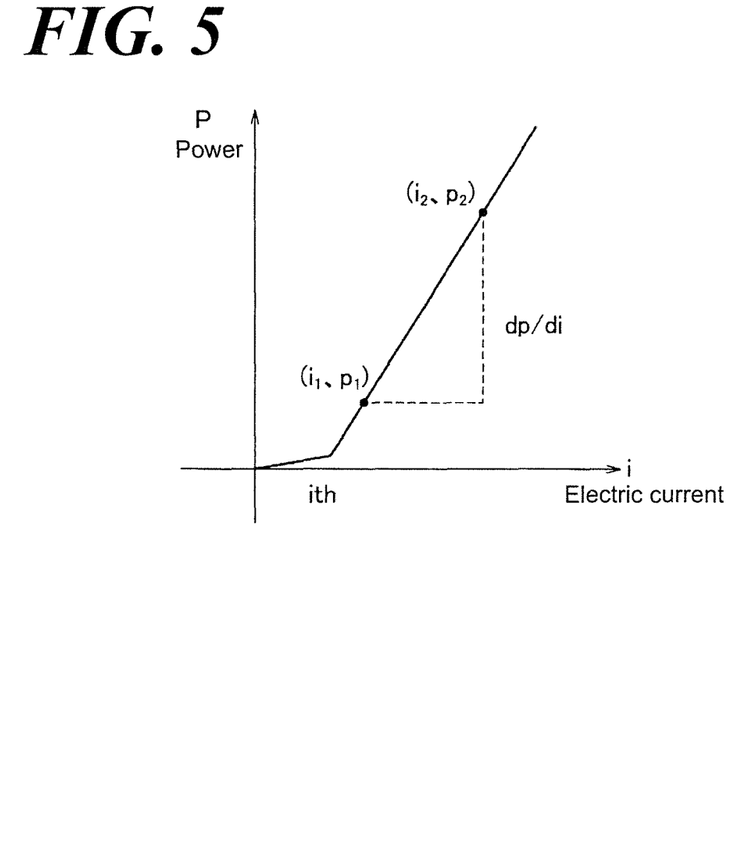
FIG. 5 is a diagram illustrating a slope efficiency of the semiconductor laser driving circuit according to the aspect of the Embodiment 2 of the present invention.

FIG. 5 is a diagram illustrating a slope efficiency of the semiconductor laser driving circuit according to the aspect of the Embodiment 2 of the present invention. Referring to FIG. 5, the method to obtain the slope efficiency dp/di based on the arbitrary two points $(i_1, p_1)$, $(i_2, p_2)$ of the slope portion of the electric current light output of the semiconductor laser LD when the laser is activated, and the point at which the line connecting the arbitrary two points $(i_1, p_1)$, $(i_2, p_2)$ crosses the transverse (electric current axis), i.e., the threshold electric current ith, is indicated.

Figure 6:
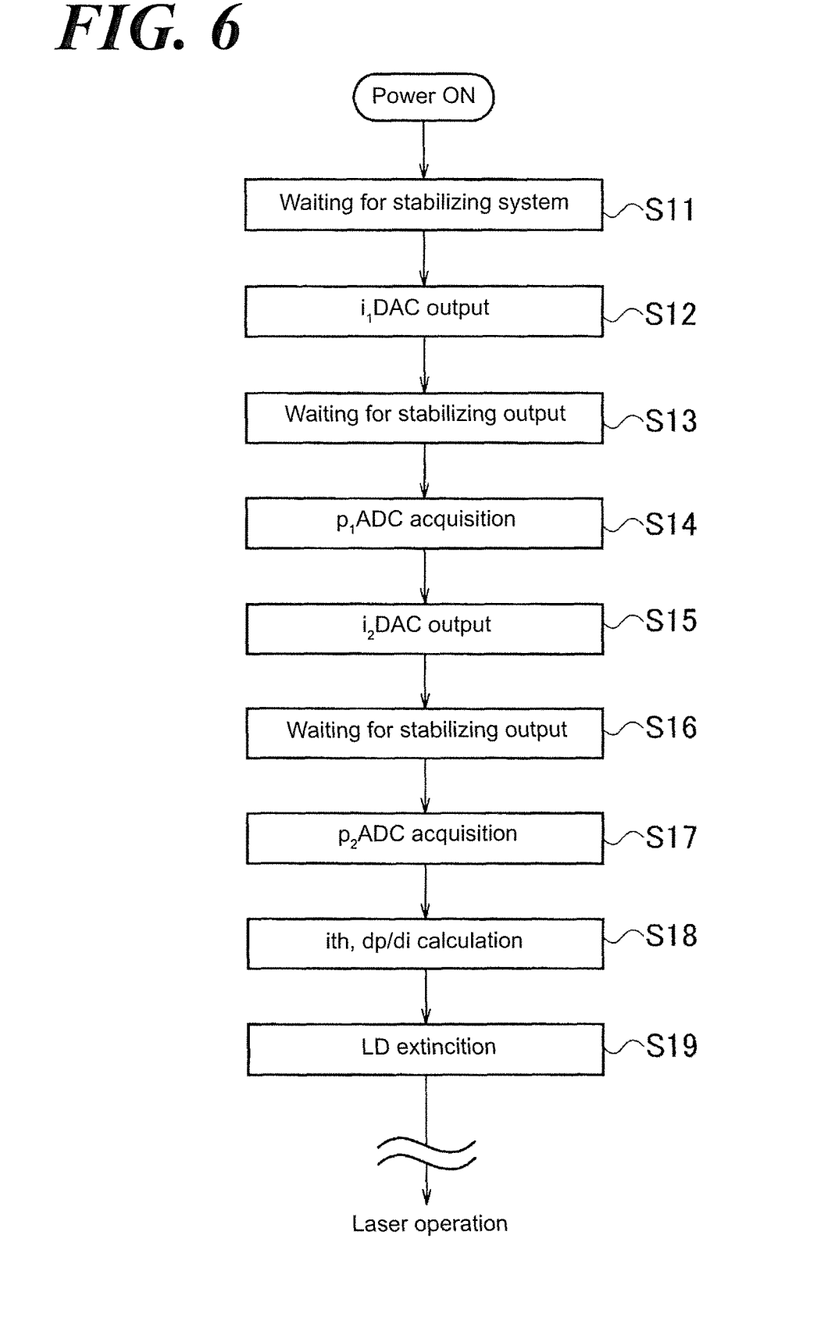
FIG. 6 is a diagram illustrating a flow-chart to calculate the constant G and the slope efficiency of the semiconductor laser driving circuit according to the aspect of the Embodiment 2 of the present invention.

Next, referring to the flow-chart in FIG. 6, the inventors set forth a calculation processing relative to the constant G_th of the semiconductor laser driving circuit and the slope efficiency according to the aspect of the Embodiment 2.

First, wait for stabilizing the system referring to FIG. 4 (Step S11). Next, the microcomputer 4 selects the terminal a of the switch 7 by the switching signal and connects the DAC5 to the power source 13.

The DAC5 converts the digital signal from the microcomputer 4 to the analog signal and outputs the analog signal, corresponding to the electric current $i_1$, to the power sources 13 (Step S12). Therefore, the electric current $i_1$ flows in the semiconductor laser LD. The semiconductor laser emits the light corresponding to the value of the electric current $i_1$, and the PD6 detects the light output $p_1$ therefrom. Then, wait for stabilizing the light output (Step S13).

The light output $p_1$ is converted to the digital signal by the ADC (analog digital converter), not shown in FIG., and sent to the microcomputer 4 (Step S14), Next, DAC5 outputs the analog signal, corresponding to the electric current $i_2$, to the power sources 13 (Step S15). Therefore, the electric current $i_2$ flows into the semiconductor laser LD. The semiconductor laser LD emits the light corresponding to the value of the electric current $i_2$, and the PD6 detects the light output $p_2$ therefrom. Then, wait for stabilizing the light output (Step S16).

The light output $p_2$ is converted to the digital signal by the ADC, not shown in FIG., and sent to the microcomputer 4 (Step S17), The microcomputer 4 calculates the slope $d_p/d_i$ based on the electric current $i_1$, the light output $p_1$, the electric current $i_2$, the light output $p_2$, and calculates the threshold electric current ith which is the point at which the line connecting the two points $(i_1, p_1)$, $(i_2, p_2)$ crosses the transverse (Step S18).

Following the calculation of the parameters, the light output relative to the analog modulation signal level. e.g. 1 mw/V, is specified, so that the slope signal v_SLOPE can be determined based on the slope efficiency $d_p/d_i$. In addition, the threshold electric current ith can be immediately determined based on the constant G_th.

Next, the semiconductor laser LD is extinct (Step S19), and the laser operation is carried out by connecting the switch 7 to the terminal b.

INDUSTRIAL APPLICABILITY

The present invention can be applied to the laser device having the analytical measurement instrumentation utilizing the laser light.

REFERENCE OF SIGNS

LD Semiconductor laser
VLD Power source
Q1, Q2 Bipolar transistor

V_ref1, V_ref2 Reference power source
1 LD Driving element
2 Differential driving element
3 Electric current control element
4 Microcomputer
5 Digital analog converter (DAC)
6 Photo diode (PD)
11, 12 Impedance element
13 Power source
14 Electric current setting circuit
21 Comparator
22 Differential modulation signal element
31 Analog modulation signal element
32 Slope signal generation element
33 Time-constant circuit
34 Threshold electric current generation element
35 Adder Those of skill would further appreciate that the various illustrative logical blocks, modules, circuits, and algorithm steps described in the flow chart steps discussed herein in connection with the embodiments disclosed herein may be implemented in any suitable manner, including as electronic hardware, computer software running on a specific purpose machine that is programmed to carry out the operations described in this application, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A semiconductor laser driving circuit, comprising:
    a semiconductor laser, of which a first electrode is connected to a power source, that emits a laser light that an analog modulation signal modulates said laser light;
    a first impedance element of which one end is connected to a second electrode of said semiconductor laser;
    a second impedance element of which one end is connected to said first electrode of said semiconductor laser and said power source;
    a differential pair circuit, wherein a first main electrode of a first transistor is connected to the other end of said first impedance element, a first main electrode of said second transistor is connected to the other end of said second impedance element, and the second main electrode of said first transistor and the second main electrode of said second transistor are connected thereto;
    a power source of which one end is connected to the second main electrode of said first transistor and the second main electrode of said second transistor;
    a differential driver that generates a differential voltage that switches on-and-off between said first transistor and said second transistor of said differential pair circuit based on said analog modulation signal;
    a slope signal generation element that generates a slope signal by executing the level conversion according to the predetermined slope coefficient relative to said analog modulation signal; and
    an adder that adds a slope signal that is generated by said slope signal generation element and said threshold electric current that said threshold electric current generation element generates and controls an electric current value of said electric current source with an addition output.

2. The semiconductor laser driving circuit, according to claim 1, wherein:
said threshold electric current that said threshold electric current generation element generates and said slope signal that said threshold electric current generation element generates are periodically updated.

3. The semiconductor laser driving circuit, according to claim 1, further comprises:
    a determination element that determines said slope signal based on a calculated slope signal based on a calculated slope efficiency;
    wherein an electric current of said semiconductor laser and a light output thereof are measured at arbitrary two points in the slope portion of the electric current of said semiconductor laser and the light output property when a laser is activated, and said slope efficiency that indicates a light output variation relative to said threshold electric current and an electric current variation is calculated based on the measurement result.

* * * * *